United States Patent
Schuster

(12) 
(10) Patent No.: US 6,683,729 B1
(45) Date of Patent: Jan. 27, 2004

(54) OBJECTIVE WITH CRYSTAL LENSES AND PROJECTION EXPOSURE EQUIPMENT FOR MICROLITHOGRAPHY

(75) Inventor: Karl-Heinz Schuster, Königsbronn (DE)

(73) Assignee: Carl Zeiss, Heidenheim (DE)

( * ) Notice: Subject to any disclaimer, the term of this patent is extended or adjusted under 35 U.S.C. 154(b) by 0 days.

(21) Appl. No.: 09/451,505

(22) Filed: Nov. 30, 1999

(30) Foreign Application Priority Data

| Nov. 30, 1998 | (DE) | ......... | 198 55 158 |
| Feb. 27, 1999 | (DE) | ......... | 198 08 544 |
| Jun. 29, 1999 | (DE) | ......... | 199 29 701 |

(51) Int. Cl.[7] ............. G02B 21/02; G02B 9/00
(52) U.S. Cl. ........ 359/656; 359/649; 359/754
(58) Field of Search ............. 359/642, 754, 359/656, 649

(56) References Cited

U.S. PATENT DOCUMENTS

| 4,701,035 | A | | 10/1987 | Hirose |
| 5,031,977 | A | * | 7/1991 | Gibson ............ 359/766 |
| 5,040,882 | A | | 8/1991 | Markle |
| 5,142,409 | A | | 8/1992 | Hanzawa et al. |
| 5,305,138 | A | | 4/1994 | Freedenberg et al. |
| 5,686,728 | A | | 11/1997 | Shafer |
| 5,717,518 | A | | 2/1998 | Shafer et al. |
| 5,781,336 | A | | 7/1998 | Coon et al. |
| 5,815,310 | A | | 9/1998 | Williamson |
| 6,101,047 | A | | 8/2000 | Chung et al. |
| 6,169,627 | B1 | | 1/2001 | Schuster |
| 6,195,213 | B1 | * | 2/2001 | Omura et al. ............ 359/727 |
| 6,243,206 | B1 | * | 6/2001 | Wangler ............ 359/621 |
| 6,295,508 | B1 | * | 7/2001 | Shigematsu ............ 359/766 |
| 6,333,781 | B1 | * | 12/2001 | Shigematsu ............ 359/766 |
| 6,377,338 | B1 | | 4/2002 | Suenaga ............ 359/727 |
| 6,451,462 | B1 | * | 9/2002 | Schuster ............ 428/696 |
| 6,451,507 | B1 | * | 9/2002 | Suenaga et al. ............ 430/311 |

FOREIGN PATENT DOCUMENTS

| DE | 222 426 A1 | 3/1984 |
| DE | 222 426 B5 | 3/1984 |
| DE | 197 04936 A1 | 2/1997 |
| DE | 199 22 209 | 6/1999 |
| DE | 199 39 088 A1 | 8/1999 |
| EP | 0 243 950 B1 | 3/1993 |
| EP | 0 809 125 A1 | 11/1997 |
| EP | 0 857 985 A1 | 6/1998 |
| EP | 0 964 307 A2 | 12/1999 |
| EP | 1 037 267 A1 | 9/2000 |
| WO | WO 98/43135 | 10/1998 |
| WO | WO 99/25008 | 5/1999 |

OTHER PUBLICATIONS

Patentschrift 845 415; Jul. 31, 1952; Ultraviolettdurchlässiges optiches System.

European Search Report; EP 99 12 1434; May 31, 2000.

U.S. patent application Ser. No. 60/094579, Shafer et al., filed Jul. 29, 1998.

(1) Mikroelektronik–Fertigung, Lithographie heute und morgen, pp. 57–60.

(2) Vacuum ultravoilet thin films, Applied Optics, Oct. 1990, pp. 4284–4292.

(3) Problemes Poses Par La Conception D'Un Objectif Photoreducteur Fonctionnant en UV, 1984, pp. 281–285.

(4) Performance Evaluation of a Practical 248 nm Wafer Stepper. Walsh et al. 1987, pp. 155–159.

(5) JR 1/1989, pp. 7–9.

* cited by examiner

*Primary Examiner*—Scott J. Sugarman

(57) ABSTRACT

An objective with lenses made of two different crystals, in particular $CaF_2$ and $BaF_2$ is particularly suitable as a refractive projection objective for microlithography at 157 nm. Such projection objectives for 193/248 nm with quartz glass and achromatization with $CaF_2$ are compaction-resistant with $BaF_2$. Microlithography projection exposure equipment in the 100–200 nm wavelength region include other fluorides and partially catadioptric objectives.

38 Claims, 3 Drawing Sheets

OBJECTIVE WITH CRYSTAL LENSES AND PROJECTION EXPOSURE EQUIPMENT FOR MICROLITHOGRAPHY

CROSS REFERENCES TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The invention relates to an objective with crystal lenses. Such objectives have been known for over a hundred years as Carl Zeiss apochromatic microscope objectives with fluorspar ($CaF_2$) lenses.

In recent times, refractive projection objectives for microlithography in the DUV at wavelengths of 248 or 193 nm have been constructed, and contain lenses of quartz glass and $CaF_2$.

2. Discussion of Relevant Art

An optical system is known from German Democratic Republic Patent DD 222 426 B5, with optical glasses and $BaF_2$ single crystal as optical media, and can be used for wavelengths of 150 up to $10^4$ nm. The embodiment example is a planapochromat for 480–800 nm with several different glasses and $BaF_2$.

The choice of materials for UV microlithographic objectives (centered on 248 nm wavelength) is described in G. Roblin, J. Optics (Paris), 15 (1984), pp. 281–285.

The outcome was that only combinations of quartz glass with $CaF_2$ or LiF are graded as usable.

In U. Behringer, F+M (Munich) 107 (1999), 57–60, fluorides such as $CaF_2$, $MgF_2$ and LiF are described as suitable for 157 nm microlithography, with reservations regarding the double refraction of $MgF_2$ and regarding the handling of LiF.

In K. F. Walsh et al., SPIE Vol. 774 (1987), 155–159, excimer lasers for wavelengths of 248, 193 and 157 nm are presented, among other things. For 248 nm quartz glass, $CaF_2$, $BaF_2$, and $MgF_2$ are named as the only applicable lens materials. For wavelengths below 248 nm, quartz glass is expected to be the only one material which is usable.

A catadioptric 1:1 projection objective for microlithography at 248 nm is described in U.S. Pat. No. 5,031,977, and contains a concave mirror, a quartz glass lens, an LiF lens, and two $CaF_2$ deflecting prisms. Neither arguments for choice of materials are given nor information on modifications of the special construction.

However, the absorption edge of quartz glass is situated close to 157 nm. $CaF_2$ still usefully transmits at 157 nm, but has too high a dispersion for a purely $CaF_2$ objective for microlithography, even for a spectrally narrowed $F_2$ excimer laser. Heretofore objectives for wavelengths below 193 nm are therefore known only as catadioptric (see German Patent Document DE 196 39 586 A of the same Inventor, and U.S. Prov. Apln. Ser. No. 60/094579 of Jul. 29, 1998) or catoptric (see U.S. Pat. No. 5,686,728) systems. Here U.S. Pat. No. 5,686,728 gives a purely mirror objective for VUV microlithography with a 126 nm, 146 nm, or 157 nm excimer laser, for example.

SUMMARY OF THE INVENTION

The invention has as its object an alternative concept of an objective with a new composition of material which opens up new possibilities of application, particularly in microlithography at low wavelengths.

This object is attained by an objective having a plurality of lenses made of at least two different crystals. This object is also attained by a microlithographic projection objective corrected for illumination with a $F_2$ excimer laser at 157 nm, wherein the projection objective is purely refractive and comprises a plurality of lenses of a material selected from the group consisting of $BaF_2$, $SrF_2$, NaF, LiF, and KF. This object is also attained by a projection exposure equipment having a light source including an excimer laser with 100–160 nm wavelength, an illumination system including refractive optical elements comprising one or more fluorides, a reticle positioning and movement system, a projection objective with a plurality of lenses comprising at least two of crystalline materials selected from the group consisting of $CaF_2$, $BaF_2$, LiF, NaF, $SrF_2$, KF and amorphous $BeF_2$, and an object positioning and movement system. A process according to the invention for the production of microstructured components provides that a substrate provided with a photosensitive layer is exposed to ultraviolet light by means of a mask and a projection exposure equipment and if necessary after development, the photosensitive layer is structured corresponding to a pattern contained on the mask.

The invention starts from the discovery that novel kinds of objective properties can be provided by the use of two different crystals in an objective. In particular, included in this is the possibility of achromatizing at low wavelengths, at which each known glass, including quartz glass, absorbs strongly. The existing reservations in microlithography against $BaF_2$ relate to 248 nm and quartz glass as the partner.

Alkali and alkaline earth halides, especially the fluorides, and also other fluorides, are known as optical materials. Their partially difficult properties as materials have however led to their outstanding transmission properties in the deep UV being made use of only in an adjunct manner. It has been shown according to the invention that optical microlithography can be extended down to about 100 nm wavelength with these and similar materials.

A pair of materials for the achromatization of 157 nm optics can be provided for the first time by the pairing of two fluoride crystals, particularly of $CaF_2$, $BaF_2$, $SrF_2$, LiF, NaF, or KF, but also of mixed crystal fluorides. The materials are already known in optical manufacture, as evidenced by the cited state of the art. Barium fluoride, strontium fluoride, or sodium fluoride are preferably used for negative lenses, and indeed only for individual ones, as this can be sufficient. Calcium fluoride then finds application not only for the positive lenses, but also for the remaining negative lenses.

It is particularly advantageous that numerical apertures greater than 0.5 are attained, even at 157 nm. The following example with a numerical aperture of 0.8 reveals this clearly. The advance in resolution of EUV microlithography caused by about 1/10 of the wavelength is thereby partially compensated, since three times the NA is attained. As against 193 mm, the resolution can be nearly halved with 109 nm, since the level of the NA is retained. For the accuracy of processing, the invented technology has dramatic advantages over EUVL caused by tenfold the wavelength.

The stitching process (exposure of the chips by columns) according to an advantageous feature of the invention has recently been talked about for microlithography at very low wavelengths, and permits image fields of reduced size as rectangles with a moderate aspect ratio and thus makes possible a dramatic reduction in size of the objectives. This in turn dramatically relieves the production problems for the lens crystals.

In a quite different kind of embodiment of the invention, it was surprisingly found that in DUV microlithography with 248 nm or 193 nm, an aging process termed "compaction" occurs in quartz glass during long-term operation; in it, the material becomes densified and consequently the refractive index and the shape of the lens become changed. This of course worsens the imaging power of the objective. Besides compensation by positionable elements, it was known that the most highly loaded image-side lenses concerned can be made of crystal, preferably of $CaF_2$, $SrF_2$ or $BaF_2$, which are substantially more stable against UV radiation.

Several embodiment examples of such a use of calcium fluoride lenses are contained in German Patent Application DE 19855157.6 of the Applicant, of the same priority date, which Application is incorporated herein by reference as part of the disclosure of the present Application.

$BaF_2$ as well as $SrF_2$ in this reference have the advantage of differing substantially less than $CaF_2$ from quartz glass in their optical properties (see Roblin, as cited hereinabove)— although this is a disadvantage in the context of achromatization. The design changes of a projection objective on replacing quartz lenses by $BaF_2$ or $SrF_2$ lenses near the image are therefore minimal. The projection objective is thus optimized by the use of two crystalline materials: $CaF_2$ for achromatization, and $BaF_2$ or $SrF_2$ against compaction.

For a 157 nm objective, purely refractive and made from one material, accordingly $CaF_2$, laser bandwidths of less than 0.1 pm are necessary, depending on the aperture and size of image field.

It cannot be expected that this value can easily be attained on changing from 193 nm to 157 nm. Once again everything is more demanding: permeability of material, layer availability, lattices for the laser components.

According to the invention, a material has been found in $BaF_2$ which is transparent and isotropic at 157 nm, which has a markedly higher dispersion at 157 nm than does $CaF_2$, and which can be supplemented with this for achromatization. $BaF_2$ first completely absorbs at about 130 nm. The closeness of the absorption edge to 157 nm is responsible for the rapid course of the change in refractive index (strong dispersion) at 157 nm. This similarly holds for other fluorides such as $SrF_2$.

Achromatization at 193 nm is established by the combination of $CaF_2$ and quartz glass. $BaF_2$ has an only slightly higher dispersion than $CaF_2$ and is situated uselessly, so to speak, between the dispersion of $CaF_2$ and quartz glass.

The situation changes for 157 nm, since quartz glass shows increased absorption. According to the general opinion heretofore, there is now no suitable partner for $CaF_2$.

This is not the case. The dispersion distance between $CaF_2$ and $BaF_2$ at 157 nm is indeed smaller than that between $CaF_2$ and quartz glass at 193 nm, but a still very good partial achromatization, to a similar level as at 193 nm, e.g., 50% color longitudinal error reduction, is always possible by a moderate use of $BaF_2$.

At 193 nm only a partial achromatization is generally carried out, in order to keep the volume of $CaF_2$ used small, for reasons of cost, availability, and material properties. At 157 nm, it is desired to keep the volume of the partner $BaF_2$ small, since it has a higher specific weight, and $BaF_2$ lenses therefore deform more strongly due to gravity.

At 193 nm as much as possible may be made of quartz glass; at 157 nm, as much as possible of $CaF_2$. Since the number of positive lenses in refractive lithographic objectives is markedly larger than that of negative lenses, it would be advantageous at 193 nm if quartz glass had a small dispersion. However, the situation is reversed: $CaF_2$ has the smaller dispersion and cannot, or should not, be used in all the positive lenses. Thus positive lenses are made of quartz glass, which depresses the degree of achromatization.

At 157 nm it is likewise desirable that the preferred material, here $CaF_2$, has a smaller dispersion than the partner.

In contrast to 193 nm, this is the case with $BaF_2$ at 157 nm. Nearly all the lenses, certainly all the positive lenses, can be of the crown, namely $CaF_2$. A few negative lenses are made of $BaF_2$, or alternatively of $SrF_2$, since the same holds qualitatively for this as for $BaF_2$.

The above statements of course also hold for lenses in a catadioptric objective, particularly also for refractive partial objectives used therein. The objective according to the invention can also be catadioptric. It is important that lenses, and not only optical auxiliary elements such as deflecting prisms or plane plates consist of crystal.

If lithography is desired with a shorter wavelength than 157 nm and at the same time with very high numerical aperture, a multitude of already known problems is encountered in aggravated form. Firstly, it must be clear that a suitable bandwidth and output power of the light source is only to be expected at excimer laser wavelengths. The spectra of the rare gases indeed emit from about 60 nm, only these are broadband and hence only accessible to purely mirror systems.

Purely mirror systems with a really extended field of between 10 and 26 mm have no aperture greater than NA=0.6 up to now.

Excimer lasers can be operated at the following wavelengths below 157 nm:

| | |
|---|---|
| NeF | 109 nm |
| $Ar_2$ | 126 nm |
| ArKr | 134 nm |
| $Kr_2$ | 147 nm. |

As regards the question of materials, $CaF_2$ is a known candidate, with very good transmission for 134 and 147 nm. For 134 and 147 nm, catadioptric lenses exclusively with $CaF_2$ as the lens material are conceivable, and hence represent nothing new. To obtain refractive objectives with more aperture, such as 0.80/0.85/0.90, the wavelength 147 nm is opened up with the above-mentioned materials system for 157 nm: positive lenses predominantly of $CaF_2$, and a few negative lenses of $BaF_2$. Since the absorption edge of $BaF_2$ is situated at about 134.5 nm, 147 nm is still separated from it by about 13 nm. This means an increased absorption, but however makes possible a more relaxed color longitudinal error correction, since $BaF_2$ at 147 nm now has a stronger dispersion than at 157 nm, and indeed with a higher increase than $CaF_2$, since the absorption edge of $CaF_2$ is situated at 125 nm.

In other words, with equally good bandwidth of the laser of 157 nm and 147 nm, in a purely refractive objective a material pair of $CaF_2$ and $BaF_2$ provides a better result as regards color correction. The absorption losses are of course higher.

At 134 nm also, no material pair for achromatization of purely refractive systems was heretofore given. This was found according to the invention in the material pair $CaF_2$—$SrF_2$. The distance to the absorption edge of $SrF_2$ at 130 nm has however to be classified as very small. The increased absorption only permits the crystal to appropriately appear in very thin and small negative lenses. Therefore such a system can only be realistic for small image fields, possibly a half field system (stitching).

$CaF_2$ is also completely excluded at 126 nm, since the distance to the absorption edge is only 1 nm.

There remain as known materials, $MgF_2$ and LiF. $MgF_2$ is strongly birefringent at 126 nm and therefore unsuitable. LiF at 126 nm is indeed transparent, but is unsuitable for smaller diameters, since the radiation loading rises and the material is impermissibly changed thereby (transmission and refractive index). Even a catadioptric system does not sufficiently come through without material in the region of the highest aperture (before the image plane). Thus for 126 nm, high aperture lithography objectives with a large field could no longer be constructed.

A further material can now be given according to the invention, especially for the highly loaded small diameter. The configuration at 126 nm consists of a catadioptric lithography objective, which mainly consists of LiF. In the lenses which are loaded with a high light intensity, it consists however of the isotropic amorphous form of $BeF_2$. The crystalline form is birefringent, similarly to crystalline quartz. The glassy, solidified form, similarly to quartz glass, is isotropic when similarly produced. Since $BeF_2$ is markedly more laser-resistant at 126 nm than LiF, it is the suitable material in a few lenses either in the beam waist or several beam waists and/or on the image end of the objective. The small number of $BeF_2$ lenses is lastly to be sought because $BeF_2$ has to be classified as a powerful respiratory poison and as a weak contact poison. For the infrared region, there are long established production lines which control the handling of poisonous optical components. It is nevertheless advantageous to restrict the number of $BeF_2$ lenses to the indispensable ones. Thus a refractive or catadioptric lithography objective is concerned, of at least one crystalline and one vitreous fluoride. $BeF_2$ has to be produced and worked in the absence of water, since it tends to take up $H_2O$, and the $H_2O$ immediately blocks the 126 nm wavelength.

Especially low $H_2O$ content $BeF_2$ production also makes the he laser wavelength at 109 nm accessible. Both components in highly pure form, LiF and $BeF_2$ make a catadioptric objective possible at 109 nm.

Optical materials with high dispersion are conventionally termed flint (glass), and those with low dispersion are termed crown (glass). The following compactly described combinations of materials are proposed according to the above-mentioned for the different DUV through VUV wavelengths.

| 193 nm: | $CaF_2$ crown | KF flint |
|---|---|---|
| | $CaF_2$ crown | KF + $SiO_2$ glass flint |
| | LiF +, $CaF_2$ crown | KF flint |
| | LiF +, $CaF_2$ crown | KF + $SiO_2$ glass flint |
| 157 + 147 nm: | $CaF_2$ and/or LiF crown | NaF, $BaF_2$ and/or $SrF_2$ flint |
| 134 nm: | $CaF_2$ crown | $SrF_2$ flint |
| | $CaF_2$ crown | NaF flint |
| | LiF crown | $SrF_2$ flint |
| | LiF crown | NaF flint |
| | LiF crown | NaF + $SrF_2$ flint | where $SrF_2$ is used for the smaller diameters, since it is more radiation-resistant than NaF.

The above-mentioned systems can have reflections eliminated with thin layer systems of $MgF_2$ and $LaF_3$. For 193 nm, $SiO_2$ and $Al_2O_3$ are additionally suitable as antireflection layers.

The possibility of eliminating reflections is an important prerequisite for the attainability of multi-membered refractive objectives, since otherwise about 10% of reflection occurs per lens surface.

Since no antireflection layers are known for 126 and 109 nm, this is another reason why catadioptric systems with fewer (e.g., 3–5) lenses are preferred.

In the case of achromatization with LiF and NaF, a possibility presents itself of dispensing with crystal-gas boundary surfaces, and thus also with antireflection layers or reflection losses.

The thermal conductivity and the thermal expansion of both materials are very similar:

| Thermal conductivity | Expansion |
|---|---|
| LiF 4.01 W/m/K | $37.0 * 10^{-6}/°$ C. |
| NaF 3.75 W/m/K | $36.0 * 10^{-6}/°$ C. |

Thus a "cemented member" can be produced by wringing, and contains one each of a + and a − lens, or two + lenses and one − lens. Since the refractive indices of the two crystals are very low and elimination of reflections is therefore difficult, this formation of a cemented member is particularly helpful.

The objective could furthermore consist of $CaF_2$ lenses, as well as individual cemented members of this kind.

Wrung members of $CaF_2$ and $BaF_2$ are also possible:

| Thermal conductivity | Expansion |
|---|---|
| $CaF_2$ 19.71 W/m/K | $18.8 * 10^{-6}/°$ C. |
| $BaF_2$ 11.72 W/m/K | $18.1 * 10^{-6}/°$ C. |

It is just the excellent thermal conductivities of the crystals in comparison with glasses that make such wringing appear more reliable, especially when there is different absorption (and thus heating).

As further crystals, the mixed fluoride crystals are above all suitable, among them those with alkali or alkaline earth and other elements, such as tin, zinc, or aluminum. High dispersion and good light resistance at high transmission in the VUV are the selection criteria here, with the avoidance of birefringence.

The above statements naturally also hold for lenses in a catadioptric objective, particularly also for refractive partial objectives used in these. The objective according to the invention can thus also be catadioptric. It is important that lenses, and not only optical auxiliary elements such as deflecting prisms or plane plates, consist of crystal.

BRIEF DESCRIPTION OF THE DRAWINGS

The invention is described in more detail with reference to the drawings, wherein.

DETAILED DESCRIPTION OF PREFERRED EMBODIMENTS

Figure 1:
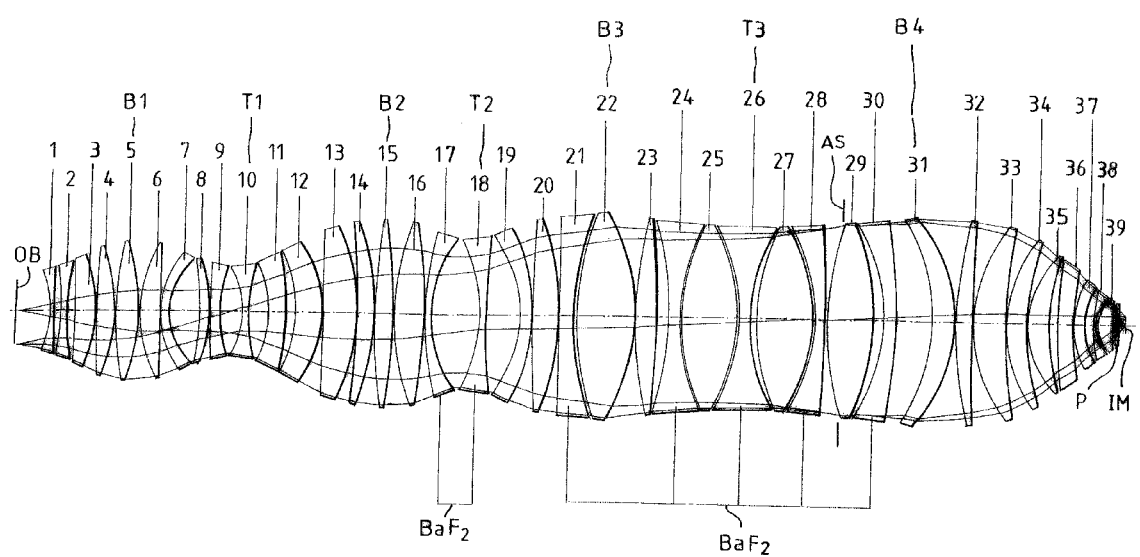
FIG. 1 shows a lens section of a 157 nm microlithography projection objective with $BaF_2$ lenses.

Table 1 gives the data for the embodiment example shown in the lens section in FIG. 1.

This relates to a microlithography projection objective for the $F_2$ excimer laser at 157 nm. By the use of $CaF_2$ and $BaF_2$ (for lenses 17, 18, 21, 24, 26, 28, 30), it was possible to realize, at a bandwidth of 0.5 pm, an image field of 8.0×13.0 mm$^2$, suitable for stitching, a reduction factor of 4.0:1, a distance from the object Ob to the image Im of 1,000 mm, and with both sides telecentric, a numerical aperture of 0.8. A further increase of the numerical aperture is entirely possible. The color longitudinal errors are reduced by a factor of 3 in comparison with a purely $CaF_2$ objective. It still amounts to CHL (500 pm)=0.095 mm. This factor can be further increased by means of additional $CaF_2$—$BaF_2$ lens pairs. The whole RMS error of the wavefront in the image IM is RMS<13 m$\lambda$ for all image heights, wherein the markedly reduced wavelength serves as the reference dimension $\lambda$.

The refractive indices at the main wavelength $\lambda_0$=157.63 nm of the $F_2$ excimer laser and at a 500 pn distance with $\lambda_1$=158.13 are:

|  |  |
| --- | --- |
| n0 = 1.5584 | n1 = 1.5571 for $CaF_2$ |
| n0 = 1.6506 | n1 = 1.6487 for $BaF_2$ |
| n0 = 1.5102 | n1 = 1.5097 for $SrF_2$ |
| n0 = 1.4781 | n1 = 1.4474 for LiF |
| n0 = 1.4648 | n1 = 1.4629 for NaF |
| n0 = 1.5357 | n1 = 1.5328 for KF |

From this an Abbe number (inverse of dispersion) results:

| | | |
| --- | --- | --- |
| $\upsilon CaF_2$ = 1219 | $\upsilon BaF_2$ = 874 | $\upsilon SrF_2$ = 392 |
| $\upsilon LiF$ = 674 | $\upsilon NaF$ = 242 | $\upsilon KF$ = 184 |

Thus at 157 nm, $BaF_2$ has a 40% higher dispersion than $CaF_2$. In comparison, quartz glass at 193 nm has about 54% of the dispersion of $CaF_2$.

The projection objective according to FIG. 1 and Table 1 has 39 lenses in all, and a plane parallel closure plate P. Seven negative lenses 17, 18, 21, 24, 26, 28 and 30 are made of $BaF_2$ for achromatization. The construction is in a direct relationship to the design in the above-mentioned Patent Application DE 19855157.6 (the content of which is also incorporated herein by reference, as a part of the present Application).

In the region of the system diaphragm AS, a third waist T3, not strongly constricted, is formed at the lens 26, following on the already conventional sequence of bulge B1 to lens 5, waist T1 at lens 10, bulge B2 at lens 15, waist T2 at lens 18, and bulge B3 at lens 22, and furthermore followed by bulge B4. The lens group of lenses 20 through 39, with the double bulge B3, B4, is particularly highly developed.

Several overcorrecting air spaces, with greater thickness at the middle than at the edge, are provided as substantial correction means in the region of the diaphragm AS between the lenses 23/24, 26/27 and 29/30, 30/31. This construction limits the lens diameter even at the highest numerical aperture. The lens radii given in Table 1—and corresponding to the respective greatest beam heights—show that the lens diameter is a maximum of 190 mm at the bulge B4. The lens diameters are also quite uniformly distributed: from lens 13 in the region of the second bulge B2 through lens 34 near the image IM, all the lens diameters are between 140 and 190 mm.

The negative $BaF_2$ lenses 21, 24, 26, 28, 30 are arranged in classical +− pairs alternating with positive $CaF_2$ lenses 22, 23, 25, 27, 29 in the region of the double bulge B3, B4, predominantly before the diaphragm AS, and are supplemented by two negative $BaF_2$ lenses 17, 18 in the region of the second waist T2. There results a very effective insertion of the second crystal material for achromatization.

The use of two crystal lens materials according to an advantageous feature of the invention results from objective designs starting from, for example, the German Patent Applications DE 19855108.8 and DE 19855157.6, of like filing date, and known from other sources, in that in a DUV objective (300–180 nm) with preponderantly quartz glass lenses and with $CaF_2$ lenses preponderantly near the diaphragm and serving for achromatization, the lenses nearest the image IM—corresponding to lenses 38, 39, and the like in FIG. 1—of quartz glass or $CaF_2$ are now replaced by $BaF_2$ or $SrF_2$ lenses. The optical properties of $BaF_2$ and $SrF_2$ differ only little from those of quartz glass, and require only routine design changes with an optical design program. The plane plate P can of course also be appropriately made of $BaF_2$. If however, as a closure and protective element, it is often changed in any case, it can also remain quartz glass (in the above-stated wavelength region).

Figure 2:
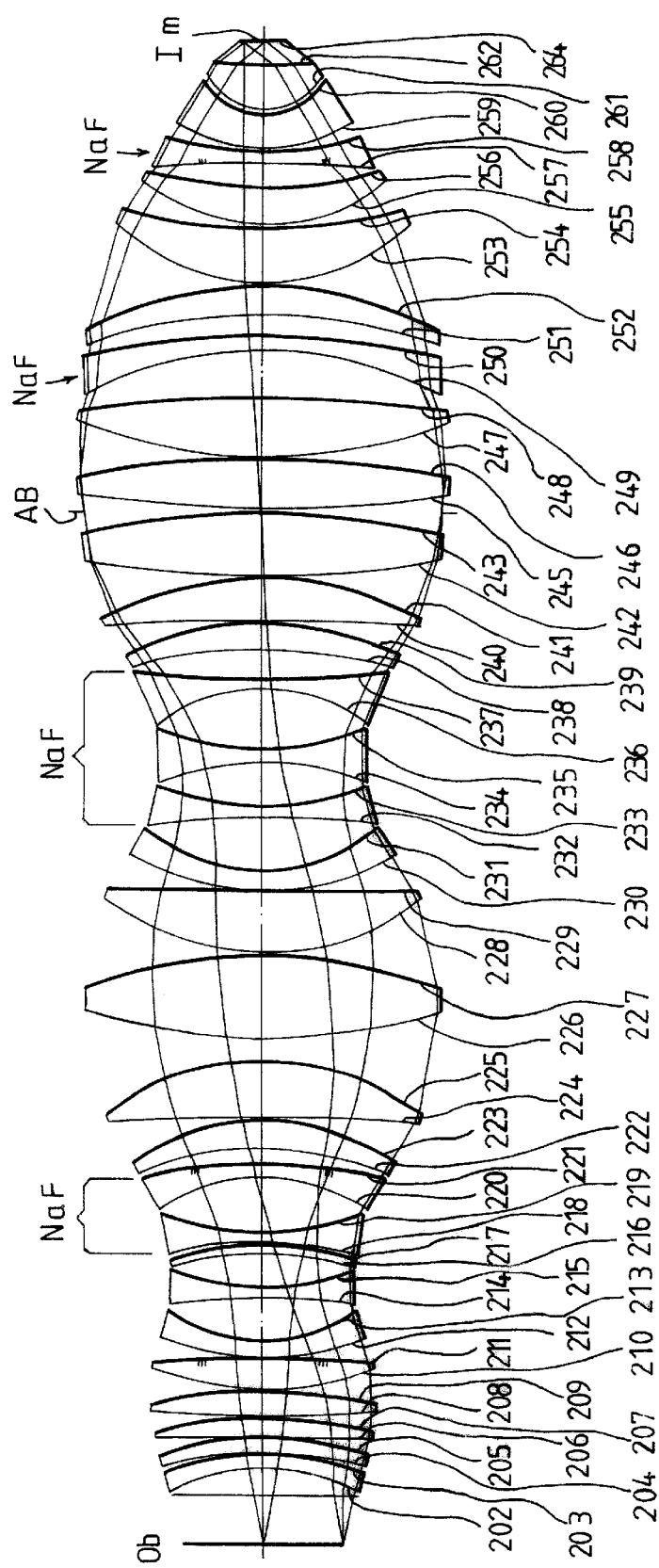
FIG. 2 shows a lens section of a 157 nm microlithography projection objective with NaF lenses and aspherics.

The embodiment of FIG. 2 shows a 157 nm, full field, scanner projection objective based on $CaF_2$ lenses, which is achromatized by the use of a total of five negative lenses 218, 219, 220, 221; 232, 233, 234, 235; 236, 237; 249, 250; 257, 258 of NaF in both waists, in the diaphragm space, and in the convergent beam path before the image plane.

A total of three aspheric lens surfaces 211, 221, 257, of which two are of NaF, contribute to good correction in a compact, material-saving construction of the objective.

Imaging scale 1:4, image field diameter 27.2 mm for an 8×26 mm full scanner field, and an image-side numerical aperture of NA=0.77 are important characteristics of the objective; its RMS image error over all image heights is below 16 m$\lambda$, with a laser bandwidth of $\Delta\lambda$=±2 pm. The chromatic longitudinal aberration for the comparison value $\Delta\lambda$=500 pm is CHL (500 pm)=0.153 mm. The individual geometric data are collected in Table 2. The largest lens diameter used is 246 mm at lenses 247, 248.

The configuring and use of the aspherics here takes place according to the principles of German Patent Application DE 199 22 209.6 of May 14, 1999 by the same Inventor, which is incorporated herein by reference.

Figure 3:
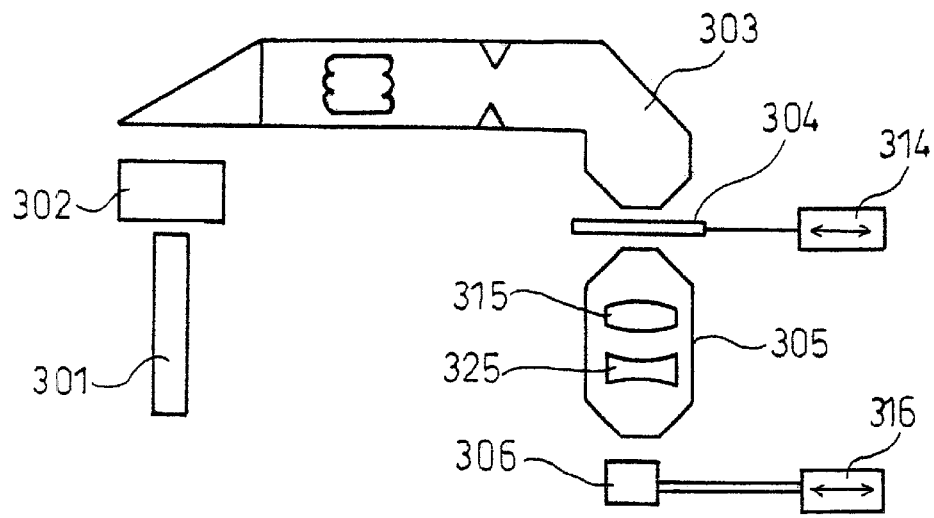
FIG. 3 shows a qualitative picture of a projection exposure equipment for microlithography.

The projection exposure equipment for microlithography schematically shown in FIG. 3 includes as the light source 301 an excimer laser, a device 302 for bandwidth reduction (this device can also be integrated into the laser), an illumination system 303 with a homogenizing and field diaphragm device and the like, a mask holder 304 with a positioning and moving device 314. A projection objective 305 according to the invention includes lenses 315, 325 made of different crystals or fluorides. The object is arranged on an object holder 306 with a positioning and moving device 316. In the embodiment as a scanner, the mask holder and the object holder are moved synchronously at speeds which differ by the imaging scale. Devices, not shown here, of course also belong to the projection exposure equipment, such as control and adjusting systems, autofocus, wafer and mask changing systems, and air conditioning.

Figure 4:
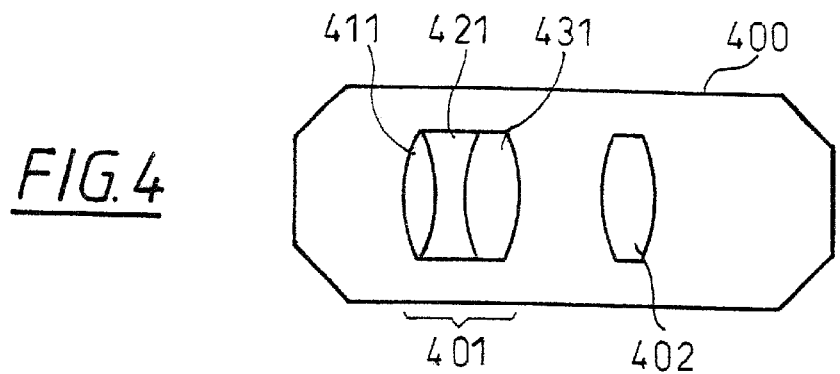
FIG. 4 schematically shows a projection objective with a cemented member.

FIG. 4 shows an objective 400 with a "cemented member" 401, i.e., a lens group jointed without an air gap and in this deep UV region held together by wringing, since no radiation resistant cement/adhesive is available. As stated above, such members are appropriate with positive LiF and negative NaF lenses, or with BaF$_2$ and CaF$_2$. Further lenses 402 in the objective 400 are then made of, e.g., of CaF$_2$ or another of the above-described materials.

Figure 5:
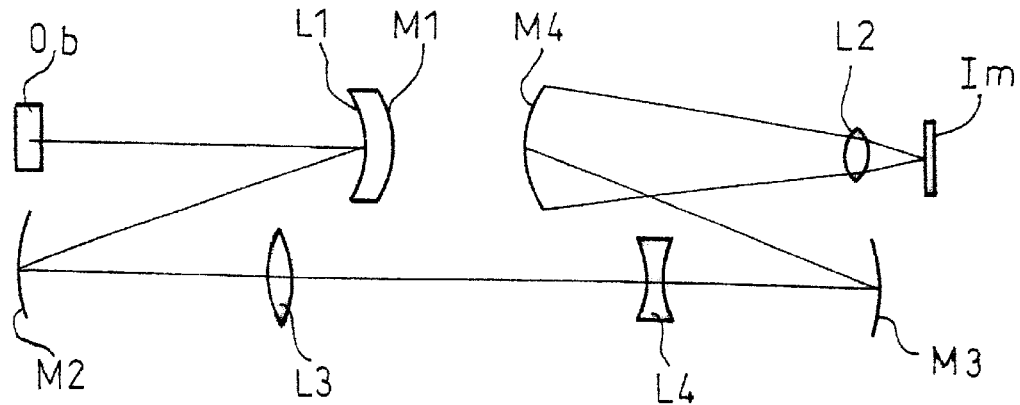
FIG. 5 schematically shows a catadioptric projection objective.

FIG. 5 shows schematically a catadioptric objective according to the invention, such as is proposed for lithography with 126 nm or 109 nm.

The object Ob is imaged on the image plane Im by means of four mirrors M1–M4 and four lenses L1–L4. A lens L1 is united with the mirror M1 to give a Mangin mirror. This facilitates manufacture and reduces reflection losses and disturbances. The lenses L1, L3, L4, in which the pencil of rays has a large cross section and thus a low intensity, are made of LiF. The lens L2 near the image, used for increasing the numerical aperture, is however exposed to concentrated radiation. Amorphous BeF$_2$ is used here because of its high radiation resistance.

The catadioptric objective should contain only few lenses, i.e. 1–10, because of absorption and the relatively difficult production of the lens materials. Such microlithographic projection objectives are known, e.g. for 193 nm; see U.S. Pat. No. 4,701,035, FIG. 12, and U.S. Pat. No. 5,815,310, FIG. 3, with NA=0.6 and quartz glass as the lens material. Specific embodiments of objectives according to the invention can be derived, starting from such systems, with advance knowledge of the optical properties of the newly given materials.

For the other objective constructions of the invention, the detailed construction can also be derived from existing designs by means of design programs. The refractive index and dispersion of the materials for the respective operating wavelength are to be used for this.

From the "Handbook of Optics", McGraw-Hill 1995, ch. 33, Properties of Crystals and Glasses, p. 33.64, ref. [125], the dispersion curves are known, for example, for LiF from 100 nm NaF from 150 nm, with extrapolation from 130 nm KF from 150 nm, with extrapolation from 130 nm.

Data on the absorption edges of BaF$_2$, CaF$_2$, MgF$_2$, SrF$_2$ and LiF are found in GB 1,276,700, relating to a bandpass filter at 130 nm. Optical constants of the above-mentioned antireflection layers can be found, e.g., in M. Zukic et al., Applied Optics 29, No. 28, October 1980, pp. 4284–4292.

The literature references given are of course only examples. The exact optical properties can also be obtained by the measurement of samples with a UV spectrometer.

The Abbe numbers for a few fluorides, and of quartz glass for comparison, are given in Table 3a for the wavelengths of the ArF and F$_2$ excimer lasers.

The quotients of the Abbe numbers derived from these are given in Table 3b for different crown/flint combinations at 157 nm. A large quotient means a strong color error correction with little flint.

According to this, the combination of crown LiF and flint KF would be ideal. The difficult properties of KF (absorption, water sensitivity) however militate against this.

However, with CaF$_2$ as the crown, only the combination with NaF can compete with the combinations having LiF as crown.

As soon as the production of lenses is possible as well from LiF as it is from CaF$_2$, objective constructions with LiF as the crown will be preferred, in combination perhaps with BaF$_2$ or NaF.

The use of crystal lenses according to the invention also provides the same advantages for catadioptric systems in the wavelength region of 100–200 nm.

A projection exposure equipment with an objective according to the invention corresponds, for example, to the constructions known from the stated Patent Applications and other sources, now of course with the objective according to the invention.

For 157 nm systems, there are provided an F$_2$ excimer laser with a moderate cost for bandwidth limitation, a matched illumination system, e.g. according to German Patent Application DE 19855196, in each case with fluoride and/or mirror optics, or else, e.g., with the objective according to the invention. Mask and wafer positioning and handling systems are used with the projection objective according to the invention for this purpose.

The aspheric lens surfaces are described in the tables with reference to the formula $$P(h) = \frac{\delta * h^2}{1 + \sqrt{1 - (1 - EX) * \delta_2 * h^2}} + C_1 h^4 + \ldots + C_n h^{2n+2}(\delta + 1/R)$$

where P is the pitch height of the aspheric deviation as a function of the height h with respect to the optical axis. $C_1$ to $C_n$ are the aspheric constants given in the tables. R is the apex radius.

TABLE 1

| Element | Radius of Curvature | Thickness | Material | Lens |
|---|---|---|---|---|
| Ob | ∞ | 8.646 | | 34.52 |
| 1 | −89.212 | 4.219 | CaF$_2$ | |
| | −16234.578 | 5.440 | | 38.01 |
| 2 | −264.742 | 5.333 | CaF$_2$ | |
| | 252.387 | 7.720 | | 43.32 |
| 3 | −660.451 | 17.777 | CaF$_2$ | |
| | −140.998 | .752 | | 50.10 |
| 4 | 1064.631 | 16.556 | CaF$_2$ | |
| | −158.471 | .750 | | 57.46 |
| 5 | 334.549 | 20.500 | CaF$_2$ | |
| | −185.783 | .750 | | 61.97 |
| 6 | 123.299 | 18.438 | CaF$_2$ | 60.05 |
| | 6416.942 | .250 | | |
| 7 | 80.830 | 6.933 | CaF$_2$ | 52.10 |
| | 59.684 | 29.393 | | |
| 8 | −270.673 | 7.923 | CaF$_2$ | 45.95 |
| | −138.947 | 1.854 | | |
| 9 | −4994.395 | 6.686 | CaF$_2$ | 42.27 |
| | 100.936 | 20.795 | | |
| 10 | −77.364 | 5.536 | CaF$_2$ | 38.79 |
| | 138.364 | 18.752 | | |
| 11 | −102.745 | 16.748 | CaF$_2$ | |
| | −267.729 | 7.811 | | 52.63 |
| 12 | −130.631 | 24.060 | CaF$_2$ | |
| | −118.058 | .755 | | 63.21 |
| 13 | −17113.629 | 30.658 | CaF$_2$ | |
| | −185.673 | .550 | | 77.37 |
| 14 | −763.483 | 14.068 | CaF$_2$ | |
| | −257.169 | .450 | | 81.41 |
| 15 | 538.062 | 17.501 | CaF$_2$ | |
| | −524.097 | .450 | | 83.64 |
| 16 | 225.158 | 28.126 | CaF$_2$ | 82.00 |
| | −455.940 | .450 | | |
| 17 | 288.200 | 5.280 | BaF$_2$ | 73.64 |
| | 116.070 | 43.999 | | |
| 18 | −136.780 | 5.899 | BaF$_2$ | |
| | 596.541 | 30.232 | | 70.04 |

TABLE 1-continued

| Element | Radius of Curvature | Thickness | Material | Lens |
|---|---|---|---|---|
| 19 | −126.579 | 12.715 | CaF$_2$ | |
|  | −160.434 | .450 | | 77.54 |
| 20 | 1476.691 | 23.253 | CaF$_2$ | |
|  | −252.721 | .450 | | 86.85 |
| 21 | −2817.234 | 11.778 | BaF$_2$ | |
|  | 231.190 | 1.794 | | 90.96 |
| 22 | 231.753 | 53.989 | CaF$_2$ | |
|  | −192.300 | .453 | | 93.26 |
| 23 | 362.633 | 20.787 | CaF$_2$ | 88.11 |
|  | −787.951 | 9.876 | | |
| 24 | −299.764 | 10.937 | BaF$_2$ | 86.45 |
|  | 190.174 | .750 | | |
| 25 | 183.395 | 50.343 | CaF$_2$ | 83.31 |
|  | −174.748 | 2.226 | | |
| 26 | −164.440 | 10.352 | BaF$_2$ | 82.14 |
|  | 168.479 | 5.874 | | 81.42 |
| 27 | 206.740 | 50.425 | CaF$_2$ | |
|  | −153.785 | 1.751 | | 82.83 |
| 28 | −154.941 | 8.763 | BaF$_2$ | |
|  | −1457.609 | .700 | | 84.91 |
| 29 | 254.394 | 43.058 | CaF$_2$ | 87.38 |
| AS | Aperture stop | .000 | | 87.38 |
|  | −217.033 | 9.211 | | |
| 30 | −162.604 | 12.00 | BaF$_2$ | |
|  | −511.982 | 32.352 | | 89.88 |
| 31 | −179.731 | 19.652 | CaF$_2$ | |
|  | −150.853 | 1.959 | | 83.87 |
| 32 | 357.035 | 16.035 | CaF$_2$ | 92.29 |
|  | 2402.661 | .935 | | |
| 33 | 141.252 | 27.158 | CaF$_2$ | 86.94 |
|  | 445.801 | .751 | | |
| 34 | 121.230 | 20.012 | CaF$_2$ | 75.94 |
|  | 251.005 | .750 | | |
| 35 | 89.189 | 18.534 | CaF$_2$ | 62.04 |
|  | 183.720 | 7.397 | | |
| 36 | 490.596 | 13.526 | CaF$_2$ | 58.00 |
|  | 255.332 | .750 | | 48.00 |
| 37 | 77.348 | 8.959 | CaF$_2$ | 39.69 |
|  | 53.225 | 7.818 | | |
| 38 | 115.034 | 2.770 | CaF$_2$ | 30.44 |
|  | 27.832 | 1.250 | | |
| 39 | 27.548 | 14.863 | CaF$_2$ | 22.66 |
|  | 193.984 | 2.347 | | |
| P | ∞ | 1.211 | CaF$_2$ | 18.16 |
| IM | ∞ | | | 17.43 |

TABLE 2

| Element | Radius | Thickness | Material |
|---|---|---|---|
| Ob |  | 17.3892 | |
| 2 | −134.1462 | 9.9551 | CaF$_2$ |
| 3 | −195.6788 | .7000 | |
| 4 | −265.1348 | 10.3165 | CaF$_2$ |
| 5 | −215.7111 | .7000 | |
| 6 | −1188.4145 | 12.7743 | CaF$_2$ |
| 7 | −266.9759 | .7000 | |
| 8 | 768.1676 | 17.0432 | CaF$_2$ |
| 9 | −326.8752 | .7000 | |
| 10 | 201.9820 | 20.6243 | CaF$_2$ |
| 11 | −1127.2372 A | .7000 | |
| 12 | 194.8406 | 10.7431 | CaF$_2$ |
| 13 | 103.5380 | 29.2205 | |
| 14 | −439.7364 | 7.0000 | CaF$_2$ |
| 15 | 157.9775 | 22.6930 | |
| 16 | −211.6271 | 7.1822 | CaF$_2$ |
| 17 | −176.9514 | .7259 | |
| 18 | −205.5616 | 7.0000 | NaF |
| 19 | 207.9612 | 36.0232 | |
| 20 | −119.6353 | 7.2489 | NaF |
| 21 | −413.0417 A | 10.3726 | |
| 22 | −218.9613 | 19.5719 | CaF$_2$ |
| 23 | −153.1211 | .7433 | |
| 24 | −1678.0689 | 38.5556 | CaF$_2$ |

TABLE 2-continued

| | | | |
|---|---|---|---|
| 25 | −171.3517 | 14.2594 | |
| 26 | 390.6431 | 55.0613 | CaF$_2$ |
| 27 | −340.4367 | 1.0036 | |
| 28 | 170.6572 | 41.3431 | CaF$_2$ |
| 29 | 2149.7419 | .7000 | |
| 30 | 179.2959 | 13.8028 | CaF$_2$ |
| 31 | 122.0160 | 35.7868 | |
| 32 | −451.7398 | 7.0000 | NaF |
| 33 | 181.5824 | 30.6167 | |
| 34 | −161.3435 | 7.0000 | NaF |
| 35 | 163.5622 | 41.2995 | |
| 36 | −111.4273 | 7.1203 | NaF |
| 37 | 736.5475 | 19.4954 | |
| 38 | −304.5919 | 18.3054 | CaF$_2$ |
| 39 | −195.3438 | .7785 | |
| 40 | −1945.5147 | 28.2366 | CaF$_2$ |
| 41 | −231.5183 | .8597 | |
| 42 | 622.3005 | 42.0816 | CaF$_2$ |
| 43 | −517.5539 | .0001 | |
| AB |  | 2.8420 | |
| 45 | 856.7969 | 32.8647 | CaF$_2$ |
| 46 | −609.0558 | .8543 | |
| 47 | 328.0241 | 39.3550 | CaF$_2$ |
| 48 | −810.7543 | 33.1869 | |
| 49 | −246.7339 | 9.3143 | NaF |
| 50 | −513.0495 | 15.0989 | |
| 51 | −342.1676 | 18.9964 | CaF$_2$ |
| 52 | −240.4190 | .9015 | |
| 53 | 142.3229 | 36.3765 | CaF$_2$ |
| 54 | 358.3715 | 2.9965 | |
| 55 | 131.5538 | 23.5624 | CaF$_2$ |
| 56 | 257.3044 | 15.9366 | |
| 57 | −1240.0410 A | 10.0142 | NaF |
| 58 | 269.2267 | .7289 | |
| 59 | 113.1907 | 23.1921 | CaF$_2$ |
| 60 | 47.2686 | 2.3140 | |
| 61 | 46.5346 | 30.1367 | CaF$_2$ |
| 61 | 354.0845 | .158942 | |
| IM | | | |

Aspheric Constants

11 A 1) −.15637086E+03  2) .14048141E−07  3) .22009617E−11
   4) −.29916689E−16  5) .27054723E−19  6) −.37664501E−23
21 A 1) −.95744229E+00  2) .13628853E−07  3) −.22507210E−11
   4) −.13590312E−16  5) −.18134368E−19  6) .24243733E−23
   7) −.23291310E−27
57 A 1) .00000000E+00  2) .46722013E−08  3) −.80987234E−13
   4) .22189307E−16  5) .16469029E−20

TABLE 3a

Abbe Numbers

| Wavelength | 193.63 nm | 157.63 nm |
|---|---|---|
| LiF | 1344.27 | 674.56 |
| CaF$_2$ | 1024.36 | 436.94 |
| SrF$_2$ | 954.39 | 391.89 |
| BaF$_2$ | 807.43 | 344.42 |
| SiO$_2$ | 714.96 | 274.61 |
| NaF | 705.92 | 242.51 |
| KF | 648.04 | 184.19 |

Definition $$\nu_{193} = \frac{n\ 193.304 - 1}{n\ 193.304 - n\ 193.804}$$

$$\nu_{157} = \frac{n\ 157.63 - 1}{n\ 157.63 - n\ 157.13}$$

TABLE 3b

Dispersion Comparison 157 nm

| Flint | Crown LiF | Crown $CaF_2$ |
|---|---|---|
| $CaF_2$ | 1.549 | — |
| $SrF_2$ | 1.721 | 1.115 |
| $BaF_2$ | 1.959 | 1.269 |
| NaF | 2.782 | 1.802 |
| KF | 3.662 | 2.372 |

I claim:

1. An objective consisting of:
a plurality of lenses comprised of at least two different crystals,
a plurality of additional lenses of vitreous material,
wherein said vitreous material comprises quartz glass or amorphous $BeF_2$.

2. A projection objective for microlithography, corrected for illumination with a $F_2$ excimer laser at 157 nm, wherein said projection objective is purely refractive and consists only of crystal lenses, at least one lens of said crystal lenses comprising a material selected from the group consisting of $BaF_2$, $SrF_2$, NaF, LiF, and KF, and at least one $CaF_2$ lens.

3. The projection objective according to claim 2, including at least one negative lens selected from the group consisting of $BaF_2$, $SrF_2$ and NaF.

4. The projection objective according to claim 2, comprising positive lenses of $CaF_2$ and individual negative lenses of $CaF_2$.

5. The projection objective according to claim 2, wherein a numerical aperture on an image side of said projection objective is greater than 0.5.

6. The projection objective according to claim 5, wherein said numerical aperture is greater than 0.6.

7. A process for production of microstructured components, comprising exposing a substrate provided with a photosensitive layer via a mask and a projection exposure equipment comprising a 157 nm wavelength ultraviolet laser light source and a refractive projection objective according to claim 2, and
structuring an image on said photosensitive layer corresponding to a pattern contained on said mask.

8. A refractive projection objective for microlithography, corrected for illumination with wavelengths below 360 nm, comprising a plurality of lenses of quartz glass, wherein at least one of two lenses nearest to an image plane of said objective comprises crystal other than $CaF_2$.

9. The objective according to claim 8, wherein said objective comprises a microlithographic projection objective, corrected for laser illumination with a wavelength below 360 nm, wherein most of said lenses comprise quartz glass, a plurality of positive lenses comprise $CaF_2$ for achromatization, and at least one lens on an image side of said objective comprises $BaF_2$, SrF2 or another fluoride in order to prevent a compaction effect.

10. The objective according to claim 9, wherein said plurality of $CaF_2$ positive lenses are in the neighborhood of a system diaphragm of said objective.

11. The objective according to claim 9, wherein said plurality of $CaF_2$ positive lenses are in the neighborhood of a system diaphragm of said objective.

12. A projection objective for microlithography with a working wavelength of 100–180 nm, comprising lenses of at least two materials selected from the group consisting of $CaF_2$, $BaF_2$, LiF, NaF, $SrF_2$, KF, and from amorphous $BeF_2$.

13. A projection objective for microlithography, comprising a catadioptric objective with a working wavelength of 100–130 nm, having a plurality of lenses of LiF or amorphous $BeF_2$.

14. An achromatic lens group comprising a plurality of wrung-together lenses of different fluorides.

15. A projection objective comprising at least one achromatic lens group according to claim 14.

16. A process for production of microstructured components, comprising exposing a substrate provided with a photosensitive layer via a mask and a projection exposure equipment comprising a 157 nm wavelength ultraviolet laser light source and a refractive projection objective comprising at least one achromatic lens group according to claim 14, and
structuring an image on said photosensitive layer corresponding to a pattern contained on said mask.

17. An achromatic lens group comprising a plurality of wrung-together lenses of different fluorides, wherein said lenses comprise NaF and LiF or $CaF_2$ and $BaF_2$.

18. An objective comprising a plurality of lenses, first lenses of the plurality of lenses being made of a fluoride crystal of a first group consisting of $CaF_2$, $BaF_2$, $SrF_2$, LiF, NaF and KF, second lenses of the plurality of lenses being made of a fluoride crystal of a second group consisting of $SrF_2$, LiF, NaF and KF.

19. The objective according to claim 18, wherein at least one lens has an aspheric surface.

20. The objective according to claim 18, wherein said lenses have a thin layer comprising an anti-reflection coating of $MgF_2$ or $LaF_3$.

21. The objective according to claim 18, comprising a plurality of converging lenses and at least one diverging lens of a material having a refractive index lower than an average refractive index of materials used in converging lenses.

22. A projection exposure equipment for microlithography, comprising:
a light source comprising an excimer laser with 100–160 nm wavelength,
an illumination system comprising refractive optical elements comprising one or more fluorides,
a reticle positioning and movement system,
a projection objective with a plurality of lenses comprising at least two lenses of crystalline materials, one crystalline material selected from a first group comprising $CaF_2$, $BaF_2$, LiF, NaF, $SrF_2$, KF and another crystalline material selected from a second group consisting of LiF, NaF, $SrF_2$, KF and amorphous $BeF_2$, and
an object positioning and movement system.

23. The projection exposure equipment according to claim 22, wherein said light source comprises an excimer laser with 109, 126, 134, 146 or 157 nm wavelength.

24. A microlithographic projection exposure equipment including a 157 nm light source and a refractive projection objective corrected for a bandwidth provided by a laser and having a finite distance between an object and an image plane comprising a plurality of lenses of at least two different crystals.

25. The projection exposure equipment according to claim 24, that is designed for a stitching process.

26. An objective comprising a plurality of lenses, at least one of said lenses comprising amorphous $BeF_2$.

27. A projection objective for microlithography, corrected for illumination with a $F_2$ excimer laser at 157 nm, wherein said projection objective is purely refractive and comprises a plurality of lenses of a material selected from the group consisting of $SrF_2$, NaF, LiF, and KF.

28. The projection objective according to claim 27, further comprising at least one $CaF_2$ lens.

29. The projection objective according to claim 27, including at least one negative lens selected from the group consisting of $BaF_2$, $SrF_2$ and NaF.

30. The projection objective according to claim 28, comprising positive lenses of $CaF_2$ and individual negative lenses of $CaF_2$.

31. A refractive projection objective for microlithography, corrected for illumination with wavelengths at or below 248 mm, comprising a plurality of lenses of quartz glass, wherein at least one of two lenses nearest to an image plane of said objective comprises crystal.

32. The refractive projection objective according to claim 31, wherein said crystal is selected from the group consisting of $CaF_2$, $SrF_2$ and $BaF_2$.

33. An objective comprising:
a plurality of lenses comprised of at least two different crystals,
a plurality of additional lenses of amorphous $BeF_2$.

34. A projection objective for microlithography with a working wavelength of 100–180 nm, comprising lenses of at least two materials selected from the group consisting of $CaF_2$, $BaF_2$, LiF, NaF, $SrF_2$, KF, and from amorphous $BeF_2$, excluding a combination of $CaF_2$ and LiF.

35. A projection objective for microlithography with a working wavelength of 100–180 nm, consisting of lenses of at least two materials selected from the group consisting of $CaF_2$, $BaF_2$, LiF, NaF, $SrF_2$, KF, and from amorphous $BeF_2$.

36. An objective consisting of a plurality of lenses, first lenses of the plurality of lenses being made of a fluoride crystal of a first group consisting of $CaF_2$, $BaF_2$, $SrF_2$, LiF, NaF and KF, second lenses of the plurality of lenses being made of a fluoride crystal of a second group consisting of $SrF_2$, LiF, NaF and KF.

37. An objective comprising a plurality of lenses, first lenses of the plurality of lenses being made of a fluoride crystal of a first group consisting of $CaF_2$, $BaF_2$, $SrF_2$, LiF, NaF and KF, second lenses of the plurality of lenses being made of a fluoride crystal of a second group consisting of $SrF_2$, LiF, NaF and KF except the combination of $CaF_2$ and LiF.

38. The refractive projection objective according to claim 8, wherein said crystal is selected from the group consisting of $CaF_2$, SrF2 and $BaF_2$.

* * * * *